United States Patent
Jayaraman et al.

(10) Patent No.: US 6,525,153 B1
(45) Date of Patent: Feb. 25, 2003

(54) POLYCYCLIC POLYMERS CONTAINING PENDANT CYCLIC ANHYDRIDE GROUPS

(75) Inventors: Saikumar Jayaraman, Twinsburg, OH (US); Brian L. Goodall, Baton Rouge, LA (US); Richard Vicari, Strongsville, OH (US); John-Henry Lipian, North Royalton, OH (US); Robert David Allen, San Jose, CA (US); Juliann Opitz, San Jose, CA (US); Thomas I. Wallow, Union City, CA (US)

(73) Assignees: Sumitomo Bakelite Co., Ltd., Tokyo (JP); International Business Machines Corp., Armonk, NY (US)

( * ) Notice: Subject to any disclaimer, the term of this patent is extended or adjusted under 35 U.S.C. 154(b) by 0 days.

(21) Appl. No.: 09/521,351

(22) Filed: Mar. 9, 2000

Related U.S. Application Data

(60) Provisional application No. 60/124,051, filed on Mar. 12, 1999.

(51) Int. Cl.[7] .................................................. C08F 10/00
(52) U.S. Cl. ........................ 526/281; 526/256; 526/257; 526/266; 526/268; 526/270; 526/271; 526/280; 526/282; 526/284; 526/286; 526/288; 526/309; 430/270.1
(58) Field of Search .................................. 526/256, 257, 526/266, 268, 270, 271, 280, 281, 282, 284, 286, 288, 309; 430/270.1

(56) References Cited

U.S. PATENT DOCUMENTS 6,232,417 B1    5/2001    Rhodes et al.

FOREIGN PATENT DOCUMENTS

| EP | 0794458 | 9/1997 |
| WO | WO9637528 | 11/1996 |
| WO | WO9733198 | 9/1997 |

OTHER PUBLICATIONS

Macromolecular Chemistry and Physics, vol. 195, No. 4, 1994, Neil Watkins et al., "Ring Opening Metathesis Polymerization of Cyclic Alkenes Containing Heteroatoms", pp. 114761164.

*Primary Examiner*—Helen L. Pezzuto
(74) *Attorney, Agent, or Firm*—Hudak, Shunk & Farine Co.; Thoburn T. Dunlap

(57) ABSTRACT

Polymers comprising polycyclic repeating units containing pendant anhydride moieties are disclosed. The polymer can be polymerized from polycycloolefins containing pendant anhydride moieties in the presence of a nickel containing single component catalyst. In optional embodiments the polycycloolefin monomer containing the pendant anhydride functionality can be copolymerized with other polycycloolefin monomers that contain pendant functional groups to yield random copolymer products.

8 Claims, No Drawings

POLYCYCLIC POLYMERS CONTAINING PENDANT CYCLIC ANHYDRIDE GROUPS

This application claims the benefit of priority under 35 U.S.C. 119(e) from Provisional Application Serial No. 60/124,051 filed on Mar. 12, 1999.

Background of the Invention

TECHNICAL FIELD

The present invention relates to polycyclic polymers. More specifically, the invention relates to polymers comprising polycyclic repeating units wherein at least a portion of which contain pendant anhydride functionality. Optionally, the polymer comprises polycyclic co-repeating units having pendant acid labile functionality to afford compositions suitable for use in photolithographic applications.

BACKGROUND

Copolymers polymerized from polycycloolefin monomers and maleic anhydride monomers are disclosed in International Patent Application Publication No. WO 97/33198 to The B. F. Goodrich Company. In one disclosed embodiment, a polycycloolefin containing a pendant acid labile group is copolymerized with maleic anhydride via a free radical process to yield a polymer product wherein the maleic anhydride becomes incorporated directly into the backbone of the polymer generally represented as follows:

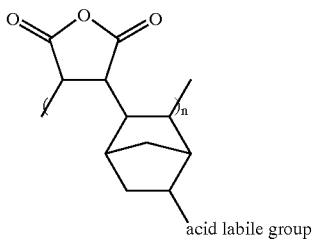
acid labile group

In European Patent Application Publication No. EP 0 794 458 to Lucent Technologies Inc. there is disclosed a copolymer polymerized from a polycycloolefin, maleic anhydride, and an acrylate or methacrylate monomer containing an acid labile group. These monomers are also polymerized via a free radical process to yield a polymer product of the general structure:

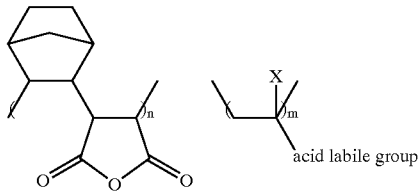
acid labile group

When polymerized via free radical processes the polycycloolefin and maleic anhydride monomers of the foregoing disclosures incorporate into the polymer backbone in a one-to-one ratio yielding an alternating copolymer. There is no disclosure of polymer products containing anhydride moieties that are pendant to the polycyclic repeating unit.

SUMMARY OF THE INVENTION

It is an object of the invention to provide novel polycyclic polymer compositions comprising repeating units containing a pendant cyclic anhydride group.

It is another object of the invention to provide polycyclic copolymer compositions containing repeating units having pendant cyclic anhydride groups in combination with one or more polycyclic repeating units having a pendant sulfonamide, hydrocarbyl, and/or functional groups.

It is still another object of the invention to provide a polycyclic copolymer composition containing repeating units having a pendant cyclic anhydride group and a pendant acid labile group.

It is a further object of the invention to provide a polycyclic copolymer composition containing repeating units having a pendant cyclic anhydride group and a pendant hydrocarbyl group.

It is another object of the invention to provide a polycyclic copolymer composition containing repeating units having a pendant cyclic anhydride group, a pendant acid labile group, and a pendant sulfonamide group.

It is still a further object of the invention to provide polymer compositions suitable for use in photoresist compositions.

The polymers of this invention are prepared by polymerizing a polycyclic monomer having the respective pendant moieties in the presence of a free radical or nickel addition catalyst. Alternatively, the polycyclic monomers can be polymerized in the presence of a ROMP catalyst.

DETAILED DESCRIPTION OF THE INVENTION

The polycyclic polymers of the present invention comprise repeating units polymerized from at least one polycycloolefin monomer wherein at least a portion of which contain a pendant anhydride group. As stated herein the terms "polycycloolefin," "polycyclic," and "norbornene-type" monomer are used interchangeably and mean that the monomer contains at least one norbornene moiety as shown below:

In the formula above, x represents oxygen, nitrogen, sulfur or a methylene group of the formula —$(CH_2)_{n'}$— wherein n' is an integer of 1 to 5.

The simplest polycyclic monomer of the invention is the bicyclic monomer, bicyclo[2.2.1]hept-2-ene, commonly referred to as norbornene. The term norbornene-type monomer is meant to include norbornene, substituted norbornene(s), and any substituted and unsubstituted higher cyclic derivatives thereof so long as the monomer contains at least one norbornene or substituted norbornene moiety. The substituted norbornenes and higher cyclic derivatives thereof contain a pendant hydrocarbyl substituent(s) or a pendant functional substituent(s) containing a heteroatom such as oxygen or nitrogen.

The anhydride functional norbornene-type monomers are represented by the structure below:

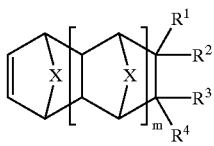

wherein x independently represents oxygen, nitrogen, sulfur or a methylene group of the formula —$(CH_2)_{n'}$—; n' is an integer of 1 to 5, preferably 1 or 2, and more preferably 1; m is an integer from 0 to 5, preferably 0 or 1; and $R^1$ and $R^4$ independently represent hydrogen, linear or branched linear and branched $C_1$–$C_{20}$ alkyl; $R^2$ and $R^3$ independently represent hydrogen, and linear and branched $C_1$–$C_{20}$ alkyl, with the proviso that at least one of $R^2$ and $R^3$ is a pendant cyclic anhydride group of the formula:

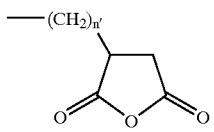

or at least one of $R^1$ and $R^2$ or $R^3$ and $R^4$ can be taken together with the ring carbon atom to which they are attached to form a spirally attached cyclic anhydride group. Monomers containing the spirally attached anhydride group can be represented by the formula:

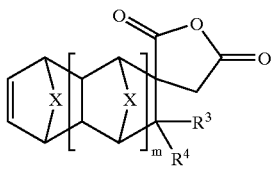

wherein $R^3$, $R^4$, x and m are as defined above.

The norbornene-type monomers of Formula I can be copolymerized with norbornene-type monomers containing pendant sulfonamide functional groups, norbornene-type monomers containing pendant hydrocarbyl and/or functional groups, and mixtures of the foregoing monomers.

The norbornene-type monomers containing pendant sulfonamide groups can be represented by Formula II below:

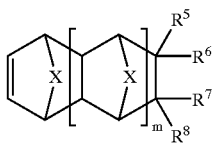

wherein x and m are as defined above and $R^5$ and $R^8$ independently represent hydrogen, linear or branched linear and branched $C_1$–$C_{20}$ alkyl; $R^6$ and $R^7$ independently represent hydrogen, linear and branched $C_1$–$C_{20}$ alkyl or a sulfonamide group, with the proviso that at least one of $R^2$ and $R^3$ is a pendant sulfonamide group of the formulae:

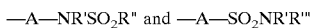

or a cyclic sulfonamide group formed by combining $R^6$ and $R^7$ together with the two ring carbon atoms to which they are attached to form a heterocyclic ring of the formula:

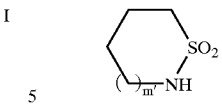

wherein m' is an integer from 1 to 3. Monomers containing the foregoing group can be represented by Formula IIa below:

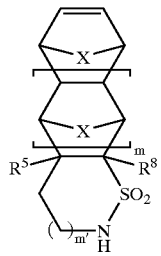

In Formula IIa $R^5$, $R^8$, x, m, and m' are as defined previously. In Formula IIa $R^5$ and, $R^8$ are preferably hydrogen.

In the formulae above —A— is a divalent radical selected from —$(CR^{1'}R^{2'})_{n'}$—, —$(CHR^{1'})_{n''}O(CHR^{1'})_{n''}$—, —$(CHR^{1'})_{n''}C(O)O(CHR^{1'})_{n''}$—, —$(CHR^{1'})_{n''}C(O)(CHR^{1'})_{n''}$—, $C_3$–$C_8$ cycloalkyl, $C_6$–$C_{14}$ aryl, cyclic ethers and cyclic diethers containing 4 to 8 carbon atoms, wherein n' independently represents an integer from 0 to 10, n" represents an integer from 1 to 10, and $R^{1'}$ and $R^{2'}$ independently represent hydrogen, linear and branched $C_1$–$C_{10}$ alkyl and halogen, preferably chlorine and fluorine. Divalent radical —A— represents the group —$(CHR^{1'})_{n''}OC(O)$— only when the sulfonamide group is —$NR'SO_2R''$.

The divalent cycloalkyl radicals include substituted and unsubstituted $C_3$ to $C_8$ cycloalkyl moieties represented by the formula:

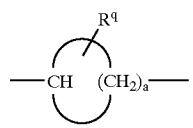

wherein "a" is an integer from 2 to 7 and $R^q$ when present represents linear and branched $C_1$–$C_{10}$ alkyl groups, linear and branched $C_1$–$C_{10}$ haloalkyl, and halogen, preferably chlorine and fluorine. As used here and throughout the specification the term haloalkyl means that at least one hydrogen atom on the alkyl radical is replaced by a halogen. The degree of halogenation can range from at least one hydrogen atom being replaced by a halogen atom (e.g., a monofluoromethyl group) to full halogenation (perhalogenation) wherein all hydrogen atoms on the alkyl group have been replaced by a halogen atom (e.g., trifluoromethyl (perfluoromethyl)). Preferred divalent cycloalkylene radicals include cyclopentylene and cyclohexylene moieties represented by the following structures:

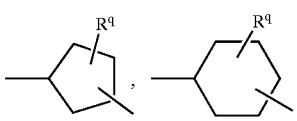

wherein $R^q$ is defined above. As illustrated here and throughout this specification, it is to be understood that the bond lines projecting from the cyclic structures and/or formulae represent the divalent nature of the moiety and indicate the points at which the carbocyclic atoms are bonded to the adjacent molecular moieties defined in the respective formulae. As is conventional in the art, the diagonal bond line projecting from the center of the cyclic structure indicates that the bond is optionally connected to any one of the carbocyclic atoms in the ring. It is also to be understood that the carbocyclic atom to which the bond line is connected will accommodate one less hydrogen atom to satisfy the valence requirement of carbon.

The divalent aryl radicals include substituted and unsubstituted aryl moieties. A representative divalent aryl moiety is shown below.

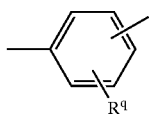

wherein $R^q$ is as defined above. In the above formulae $R^{1'}$ and $R^{2'}$ independently represent linear and branched $C_1$–$C_{10}$ alkyl, linear and branched $C_1$–$C_{10}$ haloalkyl, and halogen selected from chlorine, bromine, fluorine, and iodine, preferably fluorine.

The divalent cyclic ethers and diethers can be represented by the formulae:

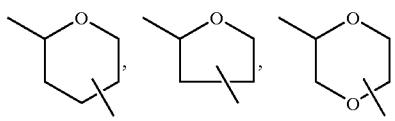

R' represents hydrogen, linear and branched tri($C_1$–$C_{10}$) alkylsilyl, —C(O)CF$_3$, and —C(O)OR, and —OC(O)OR, wherein R is linear and branched $C_1$–$C_{10}$ alkyl, preferably t-butyl, linear and branched $C_1$–$C_{10}$ haloalkyl, substituted and unsubstituted $C_6$–$C_{14}$ aryl, and substituted and unsubstituted $C_7$–$C_{20}$ aralkyl. As used here and throughout the specification the term substituted cycloalkyl, aryl (e.g., phenyl), and aralkyl means that the respective rings can contain monosubstitution or multisubstitution and the substituents are independently selected from linear and branched $C_1$–$C_5$ alkyl, linear and branched $C_1$–$C_5$ haloalkyl, substituted and unsubstituted phenyl, and halogen, preferably, chlorine and fluorine.

R" represents linear and branched $C_1$–$C_{10}$ alkyl, linear and branched $C_1$–$C_{10}$ haloalkyl, —C(O)OR, —(CHR$^1$)$_{n"}$—OR, —(CHR$^1$)$_{n"}$—C(O)R, substituted and unsubstituted $C_3$ to $C_8$ cycloalkyl(as defined above), cyclic esters (lactones) containing 2 to 8 carbon atoms (excluding the carbonyl carbon), cyclic ketones containing 4 to 8 carbon atoms (excluding the carbonyl carbon), cyclic ethers and cyclic diethers containing 4 to 8 carbon atoms, wherein R, $R^{1'}$, and n" are as defined above.

R'" represents hydrogen, linear and branched $C_1$–$C_{10}$ alkyl, linear and branched $C_1$–$C_{10}$ haloalkyl, —C(O)OR, —(CHR$^1$)$_{n"}$—OR, —(CHR$^1$)$_{n"}$—C(O)R, substituted and unsubstituted $C_3$ to $C_8$ cycloalkyl (as defined above), cyclic esters (lactones) containing 2 to 8 carbon atoms (excluding the carbonyl carbon), cyclic ketones containing 4 to 8 carbon atoms (excluding the carbonyl carbon), cyclic ethers and cyclic diethers containing 4 to 8 carbon atoms, wherein R, $R^{1'}$, and n" are as defined above.

The norbornene-type monomers containing pendant functional groups can be represented by Formula III below:

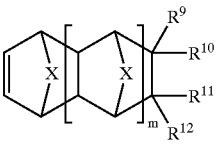

III wherein x, m, are as previously defined and $R^9$ to $R^{12}$ independently represent a radical selected from —(CH$_2$)$_n$—C(O)OR$^{13}$, —(CH$_2$)$_n$—OR$^{13}$, —(CH$_2$)$_n$—OC(O)R$^{13}$, —(CH$_2$)$_n$—C(O)R$^{13}$, —(CH$_2$)$_n$—OC(O)OR$^{13}$, and —(CH$_2$)$_n$—C(O)OR$^{14}$, wherein n independently represents an integer from 0 to 10; $R^{13}$ independently represents hydrogen, linear and branched $C_1$–$C_{10}$ alkyl, linear and branched $C_1$–$C_{10}$ haloalkyl, linear and branched $C_2$–$C_{10}$ alkenyl, linear and branched $C_2$–C alkynyl, $C_5$–$C_{12}$ cycloalkyl, $C_6$–$C_{14}$ aryl, and $C_7$–$C_{24}$ aralkyl; $R^{14}$ represents an acid labile moiety selected from —C(CH$_3$)$_3$, —Si(CH$_3$)$_3$, —CH(R$^{15}$)OCH$_2$CH$_3$, —CH(R$^{15}$)OC(CH$_3$)$_3$ or the following cyclic groups:

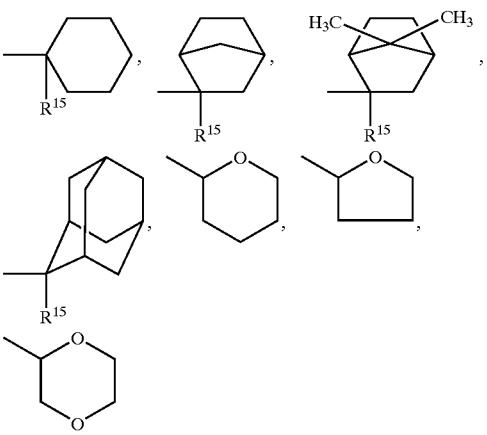

wherein $R^{15}$ represents hydrogen or a linear and branched $C_1$–$C_5$ alkyl group. The alkyl groups include methyl, ethyl, propyl, i-propyl, butyl, i-butyl, t-butyl, pentyl, t-pentyl and neopentyl. In the above structures, the single bond line projecting from the cyclic groups indicates the position where the cyclic protecting group is bonded to the acid substituent. Examples of $R^{14}$ radicals include 1-methyl-1-cyclohexyl, isobornyl, 2-methyl-2-isobornyl, 2-methyl-2-adamantyl, tetrahydrofuranyl, tetrahydropyranoyl, 3-oxocyclohexanonyl, mevalonic lactonyl, 1-ethoxyethyl, and 1-t-butoxyethyl.

The $R^{14}$ radical can also represent dicyclopropylmethyl (Dcpm), and dimethylcyclopropylmethyl (Dmcp) groups which are represented by the following structures:

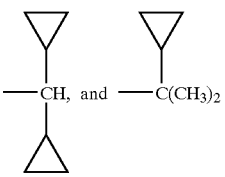

In Formula II above, preferably at least one of $R^5$ to $R^8$ is selected from the radical —(CH$_2$)$_n$—C(O)OR$^{14}$ wherein n and $R^{14}$ are as previously defined.

The norbornene-type monomers containing pendant hydrocarbyl groups can be represented by Formula IV below:

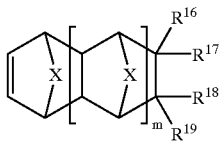

wherein x and m are as previously defined and $R^{16}$ to $R^{19}$ independently represent hydrogen, linear and branched $C_1$–$C_{10}$ alkyl, linear and branched $C_1$–$C_{10}$ haloalkyl, linear and branched, $C_2$–$C_{10}$ alkenyl, linear and branched $C_2$–$C_{10}$ alkynyl, $C_5$–$C_{12}$ cycloalkyl, $C_6$–$C_{12}$ aryl, and $C_7$–$C_{24}$ aralkyl. $R^{16}$ and $R^{19}$ together with the two ring carbon atoms to which they are attached can represent a cycloaliphatic group containing 4 to 12 carbon atoms or an aryl group containing 6 to 14 carbon atoms. The cycloalkyl, cycloaliphatic, aryl, and aryl groups set forth above can optionally be substituted with linear and branched $C_1$–$C_5$ alkyl, linear and branched $C_1$–$C_5$ haloalkyl, $C_5$–$C_{12}$ cycloalkyl, $C_6$–$C_{12}$ aryl, and halogen, preferably chlorine and fluorine.

Other monomers that can be copolymerized with the norbornene-type monomers of Formulae I, II, III, and IV are maleic anhydride, $SO_2$, CO, and acrylate and methacrylate monomers. Preferred acrylate and methacrylate monomers are represented by the formulae $CH_2=CHR^{20}C(O)OR^{13}$, and $CH_2=CHR^{20}C(O)OR^{14}$ wherein $R^{20}$ is hydrogen or methyl and $R^{13}$ and $R^{14}$ are as defined above. Accordingly, the polymers of the invention comprise repeating units polymerized from at least one monomer(s) of Formula I in optional combination with a monomer(s) selected from Formula II, Formula III, Formula IV, maleic anhydride, $SO_2$, CO, acrylate methacrylate monomers, and combinations thereof.

The addition polymers of the present invention can be prepared via standard free radical solution polymerization methods that are well-known by those skilled in the art. Typical free radical initiators are peroxygen compounds azo compounds and persulfates. Free radical initiators include, for example, benzoyl peroxide, t-butyl diperphthalate, perargouyl peroxide, 1-hydroxycyclohexyl hydroperoxide, dialkylperoxides, diacylperoxides, azodiisobutyronitrile, and dimethylazodiisobutyronitrile. Suitable solvents include alkanes such as pentane, hexane, octane, nonane, and decane, cycloalkanes such as cyclohexane, cycloheptane, cyclooctane, decalin, and norbornane, aromatic hydrocarbons such as benzene, toluene, xylene, ethylbenzene, and cumene, halogenated hydrocarbons such as chlorobutane, bromohexane, dichloroethane, and chlorobenzene, and organic solvents such as ethyl acetate, n-butyl acetate, isobutyl acetate, methylproionate, and THF. Free radical polymerization techniques are set forth in the *Encyclopedia of Polymer Science*, John Wiley & Sons, 13, 708 (1988). When copolymerizing maleic anhydride, $SO_2$, and CO into the polymer backbone free radical polymerization is the preferred route.

Alternatively, and preferably, the polycyclic monomers of this invention are addition polymerized in the presence of a catalyst represented by the formula:

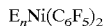

wherein n is 1 or 2 and E represents a neutral electron donor ligand. When n is 1, E preferably is a π-arene ligand preferably selected from toluene, benzene, and mesitylene. When n is 2, E preferably is selected from diethylether, tetrahydrofuran (THF), and dioxane. The ratio of monomer to catalyst (based on nickel) in the reaction medium preferably ranges from about 2000:1 to about 50:1. The reaction can be run in a hydrocarbon solvent. Preferred solvents include cyclohexane, and toluene. The reaction can be run at a temperature range of from about 0° C. to about 70° C., preferably from about 10° C. to about 50° C., and more preferably from about 20° C. to about 40° C. Preferred catalysts of the above formula include (toluene)bis (perfluorophenyl) nickel, (mesitylene)bis(perfluorophenyl) nickel, (benzene)bis(perfluorophenyl) nickel, bis (tetrahydrofuran)bis(perfluorophenyl) nickel, and bis (dioxane)bis(perfluorophenyl) nickel.

The norbornene-type monomers of Formula I, II, III and IV can alternatively be polymerized via ring-opening metathesis polymerization (ROMP). The ROMP polymers of the present invention are polymerized in the presence of a metathesis ring-opening polymerization catalyst in an appropriate solvent. Methods of polymerizing via ROMP and the subsequent hydrogenation of the ring-opened polymers so obtained are disclosed in U.S. Pat. Nos. 5,053,471 and 5,202,388 which are incorporated herein by reference.

In one ROMP embodiment the polycyclic monomers of the invention can be polymerized in the presence of a single component ruthenium or osmium metal carbene complex catalyst such as those disclosed in WO 95-US9655. The monomer to catalyst (based on the metal) ratio employed should range from about 100:1 to about 2,000:1, with a preferred ratio of about 500:1. The reaction can be conducted in halohydrocarbon solvent such as dichloroethane, dichloromethane, chlorobenzene and the like or in a hydrocarbon solvent such as toluene. The amount of solvent employed in the reaction medium should be sufficient to achieve a solids content of about 5 to about 40 weight percent, with 6 to 25 weight percent solids to solvent being preferred. The reaction can be conducted at a temperature ranging from about 0° C. to about 60° C., with about 20° C. to 50° C. being preferred.

A preferred metal carbene catalyst is bis (tricyclohexylphosphine)benzylidene ruthenium. Surprisingly and advantageously, it has been found that this catalyst can be utilized as the initial ROMP reaction catalyst and as an efficient hydrogenation catalyst to afford an essentially saturated ROMP polymer. No additional hydrogenation catalyst need be employed. Following the initial ROMP reaction, all that is needed to effect the hydrogenation of the polymer backbone is to maintain hydrogen pressure over the reaction medium at a temperature above about 100° C. but lower than about 220° C., preferably between about 150° C. to about 200° C.

The addition polymers of the invention comprise repeating units of the formula:

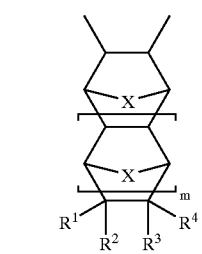

wherein x independently represents oxygen, nitrogen, sulfur or a methylene group of the formula —$CH_2)_n$—; n' is an integer of 1 to 5, preferably 1 or 2, and more preferably 1; n is an integer from 0 to 5; and $R^1$ and $R^4$ independently represent hydrogen, linear or branched linear and branched $C_1$–$C_{20}$ alkyl; $R^2$ and $R^3$ independently represent hydrogen, and linear and branched $C_1$–$C_{20}$ alkyl, with the proviso that at least one of $R^2$ and $R^3$ is a pendant cyclic anhydride group of the formula:

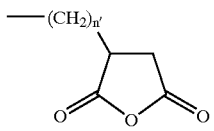

or at least one of $R^1$ and $R^2$ or $R^3$ and $R^4$ is be taken together with the ring carbon atom to which they are attached to form a spirally bonded cyclic anhydride group. Preferred repeating units under Formula Ib are represented below:

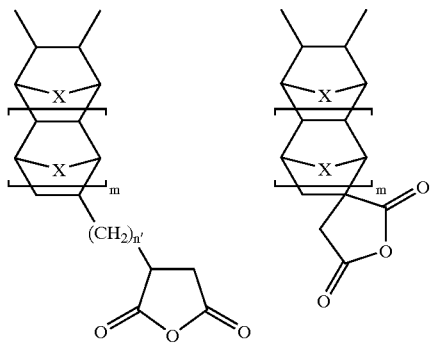

wherein x, m and n' are as previously defined.

In another embodiment of the invention the polymer comprises repeating units of Formula Ib and repeating units of Formula IIIa below:

IIIa

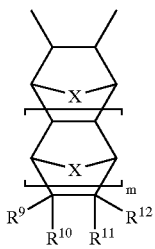

wherein $R^9$ to $R^{12}$, x, and m are as defined previously. Preferred repeating units of IIIa are selected from one or more of the repeating unit structures under Formulae IIIb and IIIc below:

IIIb

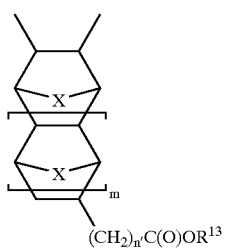

-continued

IIIc

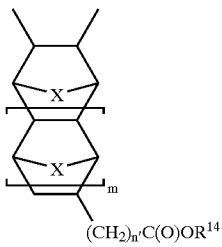

wherein x, and m are as previously defined, n' is and integer from 0 to 10, and $R^{13}$ and $R^{14}$ are as defined previously.

Repeating units containing pendant sulfomamide groups are represented by Formula IIa below:

IIa

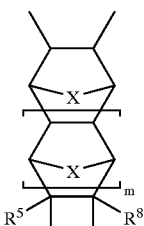

wherein x, m, and $R^5$ to $R^8$ are as previously defined.

Repeating units containing pendant hydrocarbyl groups are represented as Formula VIa as follows:

IVa

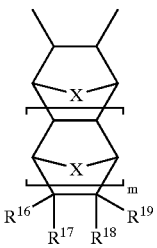

wherein x, m, and $R^{16}$ to $R^{19}$ are as previously defined.

Polymers comprising repeating units of Formula Ib and IIIc are useful in photoresist applications. These polymers can further comprise repeating units polymerized from Formulae II, III, IV, maleic anhydride, $SO_2$, CO, and combinations thereof.

The ROMP hydrogenated polymers of the invention comprise repeating units of the formula:

Ic

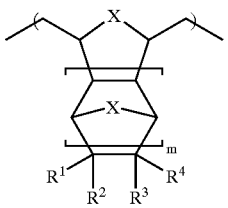

wherein x, m, and $R^1$ to $R^4$ are as defined previously. A ROMP polymer contains a repeating unit with one less cyclic unit than did the starting monomer. Accordingly, the repeating units derived from the monomers set forth under Formulae II, III and IV will have similar ring opened repeating unit structures as in Formula Ic above.

The photoresist compositions of the present invention comprise the disclosed polycyclic compositions, a solvent, and an photosensitive acid generator (photoinitiator). Optionally, a dissolution inhibitor can be added in an amount of up to about 20 weight % of the composition. A suitable dissolution inhibitor is t-butyl cholate (J. V. Crivello et al., Chemically Amplified Electron-Beam Photoresists, *Chem. Mater.*, 1996, 8, 376–381).

Upon exposure to radiation, the radiation sensitive acid generator generates a strong acid. Suitable photoinitiators include triflates (e.g., triphenylsulfonium triflate), pyrogallol (e.g., trimesylate of pyrogallol); onium salts such as triarylsulfonium and diaryliodium hexafluoroantimonates, hexafluoroarsenates, trifluoromethanesulfonates; esters of hydroxyimides, -bis-sulfonyl- diazomethanes, sulfonate esters of nitro-substituted benzyl alcohols and napthoquinone-4-diazides. Other suitable photoacid initiators are disclosed in Reichmanis et al., *Chem. Mater.* 3, 395, (1991). Compositions containing triarylsulfonium or diaryliodonium salts are preferred because of their sensitivity to deep UV light (193 to 300 nm) and give very high resolution images. Most preferred are the unsubstituted and symmetrically or unsymmetrically substituted diaryliodium or triarylsulfonium salts. The photoacid initiator component comprises about 1 to 100 w/w % to polymer. The preferred concentration range is 5 to 50 w/w %.

The photoresist compositions of the present invention optionally contain a sensitizer capable of sensitizing the photoacid initiator to longer wave lengths ranging from mid UV to visible light. Depending on the intended application, such sensitizers include polycyclic aromatics such as pyrene and perlene. The sensitization of photoacid initiators is well-known and is described in U.S. Pat. Nos. 4,250,053; 4,371,605; and 4,491,628 which are all incorporated herein by reference. The invention is not limited to a specific class of sensitizer or photoacid initiator.

The present invention also relates to a process for generating a positive tone resist image on a substrate comprising the steps of: (a) coating a substrate with a film comprising the positive tone resist composition of the present invention; (b) imagewise exposing the film to radiation; and (c) developing the image.

The first step involves coating the substrate with a film comprising the positive tone resist composition dissolved in a suitable solvent. Suitable substrates are comprised of silicon, ceramics, polymer or the like. Suitable solvents include propylene glycol methyl ether acetate (PGMEA) cyclohexanone, butyrolactate, ethyl lactate, and the like. The film can be coated on the substrate using art known techniques such as spin or spray coating, or doctor blading. Preferably, before the film has been exposed to radiation, the film is heated to an elevated temperature of about 90° C. to 150° C. for a short period of time of about 1 min. In the second step of the process, the film is imagewise exposed to radiation suitably electron beam or electromagnetic preferably electromagnetic radiation such as ultraviolet or x-ray, preferably ultraviolet radiation suitably at a wave length of about 193 to 514 nm preferably about 193 nm to 248 nm. Suitable radiation sources include mercury, mercury/xenon, and xenon lamps, x-ray or e-beam. The radiation is absorbed by the radiation-sensitive acid generator to produce free acid in the exposed area. The free acid catalyzes the cleavage of the acid labile pendant group of the copolymer which converts the copolymer from dissolution inhibitor to dissolution enhancer thereby increasing the solubility of the exposed resist composition in an aqueous base. The exposed resist composition is readily soluble in aqueous base. This solubility is surprising and unexpected in light of the complex nature of the cycloaliphatic backbone and the high molecular weight of the norbornene monomer units bearing the carboxylic acid functionality. Preferably, after the film has been exposed to radiation, the film is again heated to an elevated temperature of about 90° C. to 150° C. for a short period of time of about 1 minute.

The third step involves development of the positive tone image with a suitable solvent. Suitable solvents include aqueous base preferably an aqueous base without metal ions such as tetramethyl ammonium hydroxide or choline. The composition of the present invention provides positive images with high contrast and straight walls. Uniquely, the dissolution property of the composition of the present invention can be varied by simply varying the composition of the copolymer.

The present invention also relates to an integrated circuit assembly such as an integrated circuit chip, multichip module, or circuit board made by the process of the present invention. The integrated circuit assembly comprises a circuit formed on a substrate by the steps of: (a) coating a substrate with a film comprising the positive tone resist composition of the present invention; (b) imagewise exposing the film to radiation; (c) developing the image to expose the substrate; and (d) forming the circuit in the developed film on the substrate by art known techniques.

After the substrate has been exposed, circuit patterns can be formed in the exposed areas by coating the substrate with a conductive material such as conductive metals by art known techniques such as evaporation, sputtering, plating, chemical vapor deposition, or laser induced deposition. The surface of the film can be milled to remove any excess conductive material. Dielectric materials may also be deposited by similar means during the process of making circuits. Inorganic ions such as boron, phosphorous, or arsenic can be implanted in the substrate in the process for making p or n doped circuit transistors. Other means for forming circuits are well known to those skilled in the art.

The following examples are detailed descriptions of methods of preparation and use of certain compositions of the present invention. The detailed preparations fall within the scope of, and serve to exemplify, the more generally described methods of preparation set forth above. The examples are presented for illustrative purposes only, and are not intended as a restriction on the scope of the invention.

Example 1

(Synthesis of Norbornene Itaconic Anhydride (bicyclo[2.2.1]helpt-5-ene-2-spiro-3'-exo-succinic anhydride)

To a 500 ml dried beaker was placed 100 grams (0.8482 mols) of itaconic anhydride and 300 ml of dried THF. The solution was cloudy therefore the solution was filtered through a 0.45$\mu$ filter. A clear colorless filtrate was obtained.

Into a dried 500 ml three-neck flask equipped with a magnetic stirrer, nitrogen inlet, condenser, internal temperature monitor and addition funnel was placed the itaconic anhydride THF solution. To the itaconic anhydride solution was added via the additional funnel 90 grams (1.36 mols) of freshly prepared cyclopentadiene (CPD), the temperature of the reaction was controlled at 32–35° C. by adjusting CPD addition speed and a water bath. After the addition was complete the reaction was allowed to stir at room temperature overnight.

The reaction solution was placed on the rotovapor to remove the bulk of the THF, resulting in a solid. The solid product was crystallized from boiling hexane and dried at 30° C. in a vacuum oven, yield=86.5%. The product was identified by $^1$H and $^{13}$C NMR and IR spectroscopy.

Examples 2 to 16

A 250 ml glass reaction bottle and a 10 ml catalyst bottle were dried in an oven at 110° C. for a minimum of 4 hours. Once dry, the glass bottle was purged with dry nitrogen gas until the vessel was cool. The following monomers, norbornene, itaconic anhydride, t-butyl ester norbornene, and methyl acetate norbornene were placed into the bottle in the mole % amounts indicated in the table below. 25.33 g of toluene was also added to the reaction bottle. The vessel was crimp capped and allowed to stir until all of the itaconic norbornene monomer was in solution. The solution was purged for 20 to 30 minutes with dry nitrogen through an 18-gauge stainless steel needle. While the monomer solution was purging a dry 10 ml glass crimp neck bottle was taken into the inert atmosphere glove box along with a solvent syringe and crimp cap. 0.09173 g (1.89E-03 mol) of the nickel catalyst $(C_6H_5)Ni(C_6F_5)_2$ was weighed into the 10 ml bottle. Once the catalyst was weighed out, the vial was capped and 9.0 ml of dry toluene, already in the glove box, was added.

The catalyst was added after purging the syringe with dry nitrogen and pressurizing the catalyst solution vial. About 5 minutes into the reaction the polymer solution began to exotherm (10–15° C.). The viscosity also increased substantially. A nitrogen purge was placed on the vial to reduce the internal temperature and prevent over pressurizing. About 30 ml of dry toluene was added to the reaction mixture to reduce the viscosity. The reaction was allowed to continue for 5 hours.

Once the reaction was complete, the polymer solution was diluted with dry tetrahydrofuran in a 1:1 volume ratio. Then, 50 ml of conditioned Amberlite IRC-718 resin was added. This was allowed to mix vigorously overnight (16 to 17 hours). The resin was removed through filtration. A course glass frit filter was used first to remove the large particles and then the polymer solution was filtered through a 0.22 micron Teflon membrane filter. The polymer was isolated by precipitating into a 2:1 volume ratio of hexanes to methyl tertiary butyl ether. Once all of the polymer solution had been precipitated, the polymer was stirred slowly in the non-solvent for 1 hour. The solid polymer was filtered through a medium glass frit. The polymer was put into a pre-weighed drying dish and placed into an evacuated oven at 60° C. overnight (16 to 17 hours). $C^{13}$NMR and IR spectroscopy was used to determine the polymer composition as indicated in the table below. Molecular weight was determined by GPC and residual monomer by GC.

| Example No. | Monomer Composition (mole %) | | | Polymer Composition (mole %) | Mn | Mw | PD | Yield (%) |
| --- | --- | --- | --- | --- | --- | --- | --- | --- |
| | NB-IAH | NB-tBuE | NB-MeOAc | | | | | |
| 2 | 30 | 15 | 55 | 19/17/64 | 12357 | 30716 | 2.49 | 60 |
| 3 | 5 | 60 | 35 | 5/57/38 | 13832 | 26856 | 1.94 | 57 |
| 4 | 15 | 15 | 70 | 10/17/73 | 16994 | 42548 | 2.5 | 69 |
| 5 | 17.5 | 60 | 22.5 | 14/60/26 | 9962 | 18281 | 1.84 | 45 |
| 6 | 5 | 37.5 | 57.5 | 6/36/58 | 16224 | 34956 | 2.16 | 70 |
| 7 | 25 | 25 | 50 | 17/27/56 | 13125 | 30040 | 2.29 | 72 |
| 8 | 30 | 37.5 | 32.5 | 17/42/41 | 10507 | 22359 | 2.13 | 68 |
| 9 | 5 | 25 | 70 | 6/26/68 | 16556 | 39248 | 2.37 | 79 |
| 10 | 17.5 | 37.5 | 45 | 12/37/51 | 12564 | 29026 | 2.31 | 76 |
| 11 | 30 | 60 | 10 | 19/62/19 | 9352 | 19938 | 2.13 | 53 |
| 12 | 50 | 25 | 25 | 32/34/34 | 7453 | 15900 | 2.16 | 52 |
| 13 | 10 | 45 | 45 | 5/45/50 | 14105 | 30491 | 2.16 | 73 |
| 14 | 20 | 35 | 45 | 15/37/48 | 11961 | 27047 | 2.26 | 70 |
| 15 | 30 | 25 | 45 | 19/27/54 | 11226 | 25754 | 2.29 | 74 |
| 16 | 20 | 80 | 0 | 19/81/0 | 11828 | 22824 | 1.93 | 23 |

NB-IAH = itaconic anhydride of norbornene 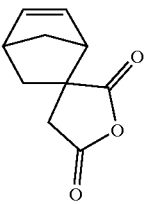

NB-tBuE = tert-butyl ester of norbornene 

NB-MeOAc = methyl acetate of norbornene 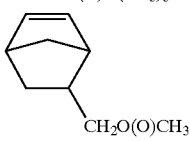

Example 17

(Synthesis of itaconic anhydride of norbornene/ norbornene-5-methyl acetate copolymer (50/50))

To a glass vial containing a stir bar was added under nitrogen atmosphere 2.59 g (14.55 mmol) of itaconic anhydride of norbornene, 2.41 g (14.51 mmol) of norbornene-5-methyl acetate, followed by 45 ml of toluene. The reaction mixture was purged with Argon for 10 minutes. To the reaction solution at room temperature was added via syringe the nickel catalyst solution in a monomer to catalyst ratio of 500/1. The catalyst solution was prepared inside the dry box by adding 0.0273 g (0.056 mmol) $(CH_3C_6H_4)Ni(C_6F_5)_2$ in 5 ml of toluene. The polymerization was allowed to stir for 6 hours after which the solution was diluted with tetrahydrofuran. The resulting polymer solution was treated first with preconditioned imidoacetic acid based Amberlite IRC-718 chelating resin, followed by Sulfonic acid based Amberlyst 15 ion exchange resin. The polymer solution was filtered, concentrated via rotary evaporation and precipitated into methanol The precipitated polymer was filtered and dried overnight under reduced pressure. The overall yield of polymer was 4.0 g (80%). The polymer was further characterized using GPC, IR and NMR. The mol wt of the polymer was observed to be Mn=30,000, with a Mw of 56,000. IR and $^1$H NMR clearly indicated presence of anhydride group.

Example 18

(Synthesis of itaconic anhydride of norbornene/ hexyl norbornene copolymer (50/50))

To a glass vial containing a stir bar was added under nitrogen atmosphere 2.5 g (14.0 mmol.) of itaconic anhydride of norbornene, 2.5 g (14.0 mmol.) of hexyl norbornene, followed by 45 ml of toluene. The reaction mixture was purged with Argon for 10 minutes. To the reaction solution at room temperature was added via syringe the nickel catalyst solution in a monomer to catalyst ratio of 100/1. The catalyst solution was prepared inside the dry box by adding 0.136 g (0.28 mmol) $(CH_3C_6H_4)Ni(C_6F_5)_2$ in 3 ml of toluene. The polymerization was allowed to stir for 6 hours after which the solution was diluted with tetrahydrofuran. The resulting polymer solution was treated first with preconditioned imidoacetic acid based Amberlite IRC-718 chelating resin, followed by Sulfonic acid based Amberlyst 15 ion exchange resin. The polymer solution was filtered, concentrated via rotary evaporation and precipitated into methanol. The precipitated polymer was filtered and dried overnight under reduced pressure. The overall yield of polymer was 2.60 g (52%). The polymer was further characterized using GPC, IR and NMR. The mol wt of the polymer was observed to be Mn=33,000, with a Mw of 154,000. IR and $^1$H NMR clearly indicated presence of anhydride group.

Example 19

(Synthesis of itaconic anhydride of norbornene/ norbornene-5-methyl acetate copolymer (25/75))

To a glass vial containing a stir bar was added under nitrogen atmosphere 3.67 g (20.6 mmol) of itaconic anhydride of norbornene, 1.327 g (7.45 mmol.) of norbornene-5-methyl acetate, followed by 15 ml of toluene and 3.0 grams of tetrahydrofuran. The reaction mixture was purged with Argon for 10 minutes. To the reaction solution at room temperature was added via syringe the nickel catalyst solution in a monomer to catalyst ratio of 100/1. The catalyst solution was prepared inside the dry box by adding 0.1436 g (0.29 mmol) $(CH_3C_6H_4)Ni(C_6F_5)_2$ in 5 ml of toluene. The polymerization was allowed to stir for 6 hours after which the solution was diluted with tetrahydrofuran. The resulting polymer solution was treated first with preconditioned imidoacetic acid based Amberlite IRC-718 chelating resin, followed by Sulfonic acid based Amberlyst 15 ion exchange resin. The polymer solution was filtered, concentrated via rotary evaporation and precipitated into methanol. The precipitated polymer was filtered and dried overnight under reduced pressure. The overall yield of polymer was 4.1 g (82%).

The polymer was further characterized using GPC, IR and NMR. The Mol. Wt of the polymer was observed to be Mn=17,000, with a Mw of 50,000. IR and $^1$H NMR clearly indicated presence of anhydride group.

Example 20

(Synthesis of itaconic anhydride of norbornene/t-butyl ester norbornene/norbornene ethyl carbonate terpolymer (40/40/20))

To a glass vial containing a stir bar was added under nitrogen atmosphere 9.38 g (52.7 mmol) of itaconic anhydride of norbornene, 20.21 g (0.104 mol) of t-butyl ester norbornene and 20.42 grams of norbornene ethyl carbonate, followed by 220 ml of toluene and 25 ml of tetrahydrofuran. The reaction mixture was purged with Argon for 10 minutes. To the reaction solution at room temperature was added via syringe the nickel catalyst solution in a monomer to catalyst ratio of 100/1. The catalyst solution was prepared inside the dry box by adding 1.27 g (2.6 mmol) $(CH_3C_6H_4)Ni(C_6F_5)_2$ in 5 ml of toluene. The polymerization was allowed to stir for 6 hours after which the solution was diluted with tetrahydrofuran. The resulting polymer solution was treated first with preconditioned imidoacetic acid based Amberlite IRC-718 chelating resin, followed by Sulfonic acid based Amberlyst 15 ion exchange resin. The polymer solution was filtered, concentrated via rotary evaporation and precipitated into methanol. The precipitated polymer was filtered and dried overnight under reduced pressure. The overall yield of polymer was 30.0 g (67.0%). The polymer was further characterized using GPC, IR and NMR. The mol wt of the polymer was observed to be Mn=15,000, with a Mw of 34,000. IR and $^1$H NMR clearly indicated presence of anhydride group.

Example 21

(Synthesis of itaconic anhydride of norbornene/t-butyl ester norbornene/norbornene-5-methyl adamntanecarboxylic ester terpolymer (40/40/20))

To a glass vial containing a stir bar was added under nitrogen atmosphere 6.25 grams (35.11 mmol) of itaconic anhydride of norbornene, 13.62 g (70.2 mmol) of t-butyl ester norbornene and 20.12 grams (70.3 mmol) of norbornene-5-methyl adamntanecarboxylic ester, followed by 72 ml of toluene and 6 ml of tetrahydrofuran. The reaction mixture was purged with Argon for 10 minutes. To the reaction solution at room temperature was added via syringe the nickel catalyst solution in a monomer to catalyst ratio of 100/1. The catalyst solution was prepared inside the dry box by adding 0.8553 g (1.75 mmol) $(CH_3C_6H_4)Ni(C_6F_5)_2$ in 5 ml of toluene. The polymerization was allowed to stir for 6 hours after which the solution was diluted with tetrahydrofuran. The resulting polymer solution was treated first with preconditioned imidoacetic acid based Amberlite IRC-718 chelating resin, followed by Sulfonic acid based Amberlyst 15 ion exchange resin. The polymer solution was filtered, concentrated via rotary evaporation and precipitated into methanol. The precipitated polymer was filtered and dried overnight under reduced pressure. The overall yield of polymer was 10.0 g (20.0%). The polymer was further characterized using GPC, IR and NMR. The mol wt of the polymer was observed to be Mn=15,000, with a Mw of 36,000. IR and $^1$H NMR clearly indicated presence of anhydride group.

Example 22

(Synthesis of itaconic anhydride of norbornene/t-butyl ester norbornene/tetracyclodecyl ethyl ester terpolymer (40/40/20))

To a glass vial containing a stir bar was added under nitrogen atmosphere 6.912 grams (38.83 mmol) of itaconic anhydride of norbornene, 15.07 g (77.7 mmol.) of t-butyl ester norbornene and 18.02 grams (77.7 mmol) of tetracyclodecyl ethyl ester, followed by 72 ml of toluene. The reaction mixture was purged with Argon for 10 minutes. To the reaction solution at room temperature was added via syringe the nickel catalyst solution in a monomer to catalyst ratio of 100/1. The catalyst solution was prepared inside the dry box by adding 0.9455 g (1.942 mmol) $(CH_3C_6H_4)Ni(C_6F_5)_2$ in 5 ml of toluene. The polymerization was allowed to stir for 6 hours after which the solution was diluted with tetrahydrofuran. The resulting polymer solution was treated first with preconditioned imidoacetic acid based Amberlite IRC-718 chelating resin, followed by Sulfonic acid based Amberlyst 15 ion exchange resin. The polymer solution was filtered, concentrated via rotary evaporation and precipitated into methanol. The precipitated polymer was filtered and dried overnight under reduced pressure. The overall yield of polymer was 30.0 g (60.0%). The polymer was further characterized using GPC, IR and NMR. The Mol. Wt of the polymer was observed to be Mn=14,000, with a Mw of 27,000. IR and $^1$H NMR clearly indicated presence of anhydride group.

Example 23

(Synthesis of norbornene-5-methyl succinic anhydride/hexyl norbornene copolymer (50/50))

To a glass vial containing a stir bar was added under nitrogen atmosphere 1.80 g (10.0 mmol) of norbornene-5-methyl succinic anhydride, 1.78 g (10.0 mmol) of hexyl norbornene, followed by 13 ml of toluene. The reaction mixture was purged with Argon for 10 minutes. To the reaction solution at room temperature was added via syringe the nickel catalyst solution in a monomer to catalyst ratio of 100/1. The catalyst solution was prepared inside the dry box by adding 0.09732 g (0.199 mmol) $(CH_3C_6H_4)Ni(C_6F_5)_2$ in 2 ml of toluene. The polymer solution was concentrated via rotary evaporation and precipitated into methanol. The precipitated polymer was filtered and dried overnight under reduced pressure. The overall yield of polymer was 2.0 g (56.0%). The polymer was further characterized using GPC. The mol wt of the polymer was observed to be Mn=38,000, with a Mw of 190,000.

Example 24

(Synthesis of norbornene-5-methyl succinic anhydride/norbornene-5-methyl acetate copolymer (50/50))

To a glass vial containing a stir bar was added under nitrogen atmosphere 1.80 g (10.0 mmol.) of norbornene-5-methyl succinic anhydride, 1.66 g (10.0 mmol.) of norbornene-5-methyl acetate, followed by 13 ml of toluene. The reaction mixture was purged with Argon for 10 minutes. To the reaction solution at room temperature was added via syringe the nickel catalyst solution in a monomer to catalyst ratio of 100/1. The catalyst solution was prepared inside the dry box by adding 0.09732 g (0.199 mmol) $(CH_3C_6H_4)Ni(C_6F_5)_2$ in 2 ml of toluene. The polymer solution was concentrated via rotary evaporation and precipitated into methanol. The precipitated polymer was filtered and dried overnight under reduced pressure. The overall yield of polymer was 2.70 g (80.0%). The polymer was further characterized using GPC. The mol wt of the polymer was observed to be Mn=20,000, with a Mw of 54,000.

Example 25

(Synthesis of norbornene-5-methyl succinic anhydride homopolymer)

To a glass vial containing a stir bar was added under nitrogen atmosphere 3.60 g (20.0 mmol) of norbornene-5-methyl succinic anhydride, followed by 13 ml of toluene. The reaction mixture was purged with Argon for 10 minutes. To the reaction solution at room temperature was added via syringe the nickel catalyst solution in a monomer to catalyst ratio of 100/1. The catalyst solution was prepared inside the dry box by adding 0.09732 g (0.199 mmol.) $(CH_3C_6H_4)Ni(C_6F_5)_2$ in 2 ml of toluene. The polymer solution was concentrated via rotary evaporation and precipitated into methanol. The precipitated polymer was filtered and dried overnight under reduced pressure. The overall yield of polymer was 2.10 g (58.2%). The polymer was further characterized using GPC. The mol wt of the polymer was observed to be Mn=8,000, with a Mw of 19,000.

Example 26

(Synthesis of itaconic anhydride of norbornene/tetracyclodecyl t-butyl ester copolymer (50/50))

To a glass vial containing a stir bar was added under nitrogen atmosphere 8.13 g (45.6 mmol) of itaconic anhydride of norbornene, 11.87 g (45.6 mmol) of tetracyclodecyl t-butyl ester, followed by 25 ml of toluene. The reaction mixture was purged with Argon for 10 minutes. To the reaction solution at room temperature was added via syringe the nickel catalyst solution in a monomer to catalyst ratio of 50/1. The catalyst solution was prepared inside the dry box by adding 0.8894 g (0.91 mmol) $(CH_3C_6H_4)Ni(C_6F_5)_2$ in 5 ml of toluene. The polymerization was allowed to stir for 6 hours after which the solution was diluted with tetrahydrofuran. The resulting polymer solution was treated first with preconditioned imidoacetic acid based Amberlite IRC-718 chelating resin, followed by Sulfonic acid based Amberlyst 15 ion exchange resin. The polymer solution was filtered, concentrated via rotary evaporation and precipitated into methanol. The precipitated polymer was filtered and dried overnight under reduced pressure. The overall yield of polymer was 12.5 g (62.5%). The polymer was further characterized using GPC, IR and NMR. The mol wt of the polymer was observed to be Mn=13,000, with a Mw of 23,000. IR and $^1$H NMR clearly indicated presence of anhydride group.

Examples 27 to 35

The following illustrate the general procedure used to synthesize the polymer. Compositions are set forth in the table below.

To a glass vial containing a stir bar was added under nitrogen atmosphere the following monomers, N-(bicyclo (2.2.1)hept-5-ene-2-ylmethyl) methanesulfonamide, of t-butylester of norbornene, and the itaconic anhydride of norbornene in the amounts indicated in the table below. To the monomer composition 20.37 g of toluene was then added. The reaction mixture was purged with nitrogen for 30 minutes. To the reaction solution (at room temperature) was added via syringe the nickel catalyst solution in a monomer to catalyst ratio of 50/1. The catalyst solution was prepared inside the dry box by adding 0.734 g (1.5 mmol) of $(CH_3C_6H_4)Ni(C_6F_5)_2$ in 4 ml of toluene. The polymerization was allowed to stir for 6 hours after which the solution was diluted with tetrahydrofuran. The resulting polymer solution was treated first with preconditioned imidoacetic acid based Amberlite IRC-718 chelating resin, filtered, then treated with Amberlyst 15 ion exchange resin. The polymer solution was filtered, concentrated via rotary evaporation and precipitated into hexanes. The precipitated polymer was filtered and dried overnight under reduced pressure. The polymer was further characterized using GPC, IR and NMR. IR and $^1H$ NMR clearly indicated presence of sulfonamide group. The table below sets forth the molecular weight results.

| Example | Polymer Mol. Wt. |  |  |
|---|---|---|---|
|  | Mn | Mw | PD |
| Monomer Composition NB-Mesulfonamide/NB-IAH/NB-tBuE/NB-MeOAc | | | |
| 27 | 40/20/40/0 | 8907 | 17097 | 1.92 |
| 28 | 30/10/30/30 | 11405 | 21107 | 1.85 |
| 29 | 30/10/40/20 | 10708 | 20194 | 1.87 |
| 30 | 40/10/30/20 | NA | | |
| 31 | 30/20/30/20 | NA | | |
| Monomer Composition NB-IAH/NB-pr Sulf/NB-tBu-E/NB-MeOAc | | | |
| 32 | 50/50 | 9925 | 19853 | 2.00 |
| 33 | 20/40/30/10 | 9791 | 18784 | 1.918 |
| 34 | 10/30/30/30 | 15547 | 35430 | 2.279 |
| 35 | 20/20/40/20 | 12415 | 26187 | 2.109 |

NB-Mesulfonamide = methylsulfonamide of norbornene

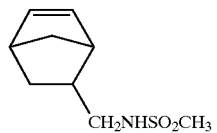

NB-PrSulf = propylsulfonamide of norbornene

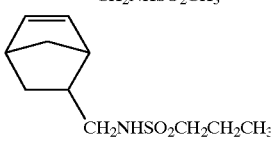

What is claimed is:

1. A polycyclic polymer comprising a repeating unit of the structure:

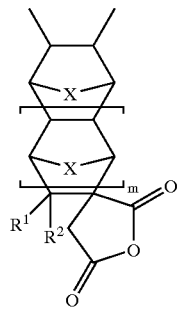

wherein x independently represents oxygen, nitrogen, sulfur or a methylene group of the formula $-(CH_2)_{n'}-$; n' is an integer of 1 to 5; m is an integer from 0 to 5; and $R^1$ and $R^2$ independently represent hydrogen and linear or branched $C_1-C_{20}$ alkyl.

2. The polycyclic polymer of claim 1 further comprising a repeating unit selected from one or more of the structures represented below:

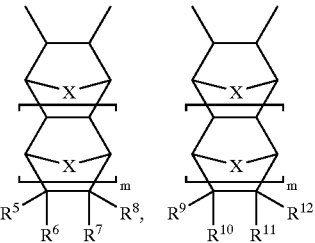

wherein x and m are as defined above and $R^5$ and $R^8$ independently represent hydrogen, linear or branched linear and branched $C_1-C_{20}$ alkyl; $R^6$ and $R^7$ independently represent hydrogen, linear and branched $C_1-C_{20}$ alkyl or a sulfonamide group, with the proviso that at least one of $R^2$ and $R^3$ is a pendant sulfonamide group of the formulae:

$$-A-NR'SO_2R'' \text{ and } -A-SO_2NR'R'''$$

or a cyclic sulfonamide group formed by combining $R^6$ and $R^7$ together with the two ring carbon atoms to which they are attached to form a heterocyclic ring of the formula:

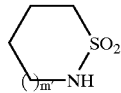

wherein m' is an integer from 1 to 3; —A— is a divalent radical selected from $-(CR^1R^{2'})_{n'}-$, $-(CHR^{1'})_{n''}O(CHR^{1'})_{n''}-$, $-(CHR^{1'})_{n''}C(O)O(CHR^{1'})_{n''}-$, $-(CHR^{1'})_{n''}C(O)(CHR^{1'})_{n''}-$, substituted and unsubstituted $C_3-C_8$ cycloalkyl, substituted and unsubstituted $C_6-C_{14}$ aryl, cyclic ethers and cyclic diethers containing 4 to 8 carbon atoms, and divalent radical —A— represents the group $-(CHR^{1'})_{n''}OC(O)-$ only when the sulfonamide group is $-NR'SO_2R''$; R' represents hydrogen, linear and branched tri($C_1-C_{10}$) alkylsilyl, $-C(O)CF_3$, and $-C(O)OR$, and $-OC(O)OR$; R'' represents linear and branched $C_1-C_{10}$ alkyl, linear and branched $C_1-C_{10}$ haloalkyl, $-C(O)OR$, $-(CHR^{1'})_{n''}-OR$, $-(CHR^{1'})_{n''}-C(O)R$, substituted and unsubstituted C₃ to C₈ cycloalkyl cyclic esters containing 2 to 8 carbon atoms, cyclic ketones containing 4 to 8 carbon atoms, cyclic ethers and cyclic diethers containing 4 to 8 carbon atoms; R'" represents hydrogen, linear and branched $C_1$–$C_{10}$ alkyl, linear and branched $C_1$–$C_{10}$ haloalkyl, —C(O)OR, —(CHR¹)ₙ„—OR, —(CHR¹)ₙ„—C(O)R, substituted and unsubstituted C₃ to C₈ cycloalkyl, cyclic esters containing 2 to 8 carbon atoms, cyclic ketones containing 4 to 8 carbon atoms, cyclic ethers and cyclic diethers containing 4 to 8 carbon atoms; wherein R represents linear and branched $C_1$–$C_{10}$ alkyl, linear and branched $C_1$–$C_{10}$ haloalkyl, substituted and unsubstituted $C_6$–$C_{14}$ aryl, and substituted and unsubstituted $C_7$–$C_{20}$ aralkyl; $R^{1'}$ and $R^{2'}$ independently represent hydrogen, linear and branched $C_1$–$C_{10}$ alkyl, linear and branched $C_1$–$C_{10}$ haloalkyl and halogen; n' represents an integer from 0 to 10, and n" independently represents an integer from 1 to 10; $R^9$ to $R^{12}$ independently represent a radical selected from —(CH₂)ₙ—C(O)OR¹³, —(CH₂)ₙ—OR¹³, —(CH₂)ₙ—OC(O)R¹³, —(CH₂)ₙ—C(O)R¹³, —(CH₂)ₙ—OC(O)OR¹³, and —(CH₂)ₙ—C(O)OR¹⁴, wherein n independently represents an integer from 0 to 10; $R^{13}$ independently represents hydrogen, linear and branched $C_1$–$C_{10}$ alkyl, linear and branched $C_1$–$C_{10}$ haloalkyl, linear and branched $C_2$–$C_{10}$ alkenyl, linear and branched $C_2$–$C_{10}$ alkynyl, $C_5$–$C_{12}$ cycloalkyl, $C_6$–$C_{14}$ aryl, and $C_7$–$C_{24}$ aralkyl; $R^{14}$ represents an acid labile moiety selected from —C(CH₃)₃, —Si(CH₃)₃, —CH(R¹⁵)OCH₂CH₃, —CH(R¹⁵)OC(CH₃)₃ or the following cyclic groups:

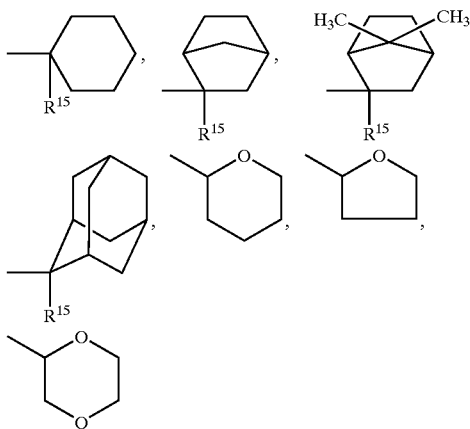

or the groups:

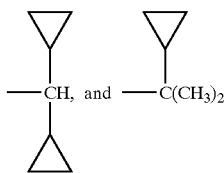

wherein $R^{15}$ represents hydrogen or a linear and branched $C_1$–$C_5$ alkyl; with the proviso that at least one of $R^5$ to $R^8$ selected from the radical —(CH₂)ₙ—C(O)OR¹⁴ as defined previously.

3. The polycyclic polymer of claim 2 further comprising a repeating unit represented as follows:

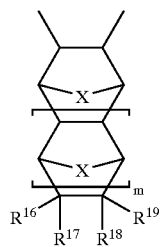

wherein x and m are as defined above and $R^{16}$ to $R^{19}$ independently represent hydrogen, linear and branched $C_1$–$C_{10}$ alkyl, linear and branched $C_1$–$C_{10}$ haloalkyl, linear and branched, $C_2$–$C_{10}$ alkenyl, linear and branched $C_2$–$C_{10}$ alkynyl, substituted and unsubstituted $C_5$–$C_{12}$ cycloalkyl, substituted and unsubstituted $C_6$–$C_{12}$ aryl, and substituted and unsubstituted $C_7$–$C_{24}$ aralkyl; $R^{16}$ and $R^{19}$ together with the two ring carbon atoms to which they are attached can represent a substituted and unsubstituted cycloaliphatic group containing 4 to 12 carbon atoms or an substituted and unsubstituted aryl group containing 6 to 14 carbon atoms.

4. The polycyclic polymer of claim 1, 2, or 3 further comprising a repeating unit polymerized from the group consisting of maleic anhydride, SO₂, CO, and mixtures thereof.

5. A photoresist composition comprising a photoacid initiator, an optional dissolution inhibitor, and a polycyclic polymer comprising a repeating unit of the structure:

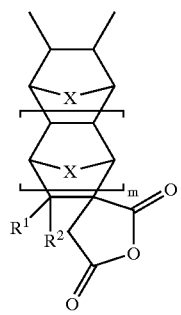

and at least one repeating unit selected from a repeating unit of the structure:

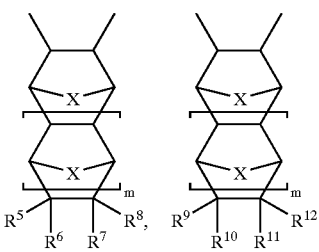

wherein in the above structural formulae x independently represents oxygen, nitrogen, sulfur or a methylene group of the formula —(CH₂)ₙ'—; n' is an integer of 1 to 5; m is an integer from 0 to 5; and $R^1$ and $R^2$ independently represent hydrogen, linear or branched $C_1$–$C_{20}$ alkyl; $R^5$ and $R^8$ independently represent hydrogen, linear or branched linear and branched $C_1$–$C_{20}$ alkyl; $R^6$ and $R^7$ independently represent hydrogen, linear and branched $C_1$–$C_{20}$ alkyl or a sulfonamide group, with the proviso that at least one of $R^2$ and $R^3$ is a pendant sulfonamide group of the formulae:

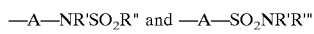

or a cyclic sulfonamide group formed by combining $R^6$ and $R^7$ together with the two ring carbon atoms to which they are attached to form a heterocyclic ring of the formula:

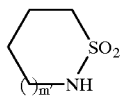

wherein m' is an integer from 1 to 3; —A— is a divalent radical selected from —$(CR^{1'}R^{2'})_{n'}$—, —$(CHR^{1'})_{n''}O(CHR^{1'})_{n''}$—, —$(CHR^{1'})_{n''}C(O)O(CHR^{1'})_{n''}$—, —$(CHR^{1'})_{n''}C(O)(CHR^{1'})_{n''}$—, substituted and unsubstituted $C_3$–$C_8$ cycloalkyl, substituted and unsubstituted $C_6$–$C_{14}$ aryl, cyclic ethers and cyclic diethers containing 4 to 8 carbon atoms, and divalent radical —A— represents the group —$(CHR^{1'})_{n''}OC(O)$— only when the sulfonamide group is —$NR'SO_2R''$; R' represents hydrogen, linear and branched tri($C_1$–$C_{10}$) alkylsilyl, —$C(O)CF_3$, and —$C(O)OR$, and —$OC(O)OR$; R" represents linear and branched $C_1$–$C_{10}$ alkyl, linear and branched $C_1$–$C_{10}$ haloalkyl, —$C(O)OR$, —$(CHR^{1'})_{n''}OR$, —$(CHR^{1'})_{n''}C(O)R$, substituted and unsubstituted $C_3$ to $C_8$ cycloalkyl cyclic esters containing 2 to 8 carbon atoms, cyclic ketones containing 4 to 8 carbon atoms, cyclic ethers and cyclic diethers containing 4 to 8 carbon atoms; R'" represents hydrogen, linear and branched $C_1$–$C_{10}$ alkyl, linear and branched $C_1$–$C_{10}$ haloalkyl, —$C(O)OR$, —$(CHR^{1'})_{n''}$—OR, —$(CHR^{1'})_{n''}$—C(O)R, substituted and unsubstituted $C_3$ to $C_8$ cycloalkyl, cyclic esters containing 2 to 8 carbon atoms, cyclic ketones containing 4 to 8 carbon atoms, cyclic ethers and cyclic diethers containing 4 to 8 carbon atoms; wherein R represents linear and branched $C_1$–$C_{10}$ alkyl, linear and branched $C_1$–$C_{10}$ haloalkyl, substituted and unsubstituted $C_6$–$C_{14}$ aryl, and substituted and unsubstituted $C_7$–$C_{20}$ aralkyl; $R^{1'}$ and $R^{2'}$ independently represent hydrogen, linear and branched $C_1$–$C_{10}$ alkyl, linear and branched $C_1$–$C_{10}$ haloalkyl and halogen; n' represents an integer from 0 to 10, and n" independently represents an integer from 1 to 10; $R^9$ to $R^{12}$ independently represent a radical selected from —$(CH_2)_n$—$C(O)OR^{13}$, —$(CH_2)_n$—$OR^{13}$, —$(CH_2)_n$—$OC(O)R^{13}$, —$(CH_2)_n$—$C(O)R^{13}$, —$(CH_2)_n$—$OC(O)OR^{13}$, and —$(CH_2)_n$—$C(O)OR^{14}$, wherein n independently represents an integer from 0 to 10; $R^{13}$ independently represents hydrogen, linear and branched $C_1$–$C_{10}$ alkyl, linear and branched $C_1$–$C_{10}$ haloalkyl, linear and branched $C_2$–$C_{10}$ alkenyl, linear and branched $C_2$–$C_{10}$ alkynyl, $C_5$–$C_{12}$ cycloalkyl, $C_6$–$C_{14}$ aryl, and $C_7$–$C_{24}$ aralkyl; $R^{14}$ represents an acid labile moiety selected from —$C(CH_3)_3$, —$Si(CH_3)_3$, —$CH(R^{15})OCH_2CH_3$, —$CH(R^{15})OC(CH_3)_3$ or the following cyclic groups:

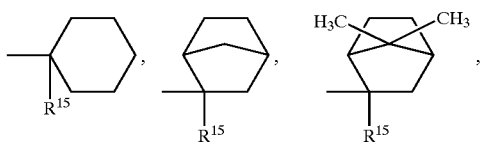

-continued

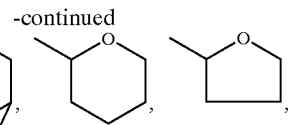

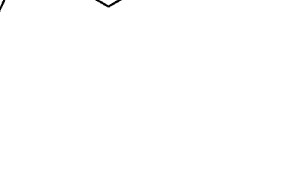

or the groups:

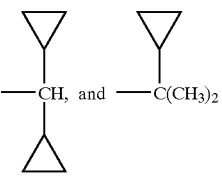

wherein $R^{15}$ represents hydrogen or a linear and branched $C_1$–$C_5$ alkyl; with the proviso that at least one of $R^5$ to $R^8$ is selected from the radical —$(CH_2)_n$—$C(O)OR^{14}$ as defined previously.

6. The photoresist composition of claim 5 wherein said polycyclic polymer further comprises a repeating unit represented as follows:

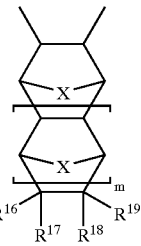

wherein x and m are as defined above and $R^{16}$ to $R^{19}$ independently represent hydrogen, linear and branched $C_1$–$C_{10}$ alkyl, linear and branched $C_1$–$C_{10}$ haloalkyl, linear and branched, $C_2$–$C_{10}$ alkenyl, linear and branched $C_2$–$C_{10}$ alkynyl, substituted and unsubstituted $C_5$–$C_{12}$ cycloalkyl, substituted and unsubstituted $C_6$–$C_{12}$ aryl, and substituted and unsubstituted $C_7$–$C_{24}$ aralkyl; $R^{16}$ and $R^{19}$ together with the two ring carbon atoms to which they are attached can represent a substituted and unsubstituted cycloaliphatic group containing 4 to 12 carbon atoms or an substituted and unsubstituted aryl group containing 6 to 14 carbon atoms.

7. The photoresist composition of claim 5 or 6 wherein the polycyclic polymer further comprises a repeating unit polymerized from the group consisting of maleic anhydride, $SO_2$, CO, and mixtures thereof.

8. The photoresist composition of claim 5, 6, or 7 wherein said photoacid initiator is selected from the group consisting of triflates; pyrogallol; onium salts selected from triarylsulfonium and diaryliodium hexafluoroantimonates, hexafluoroarsenates, trifluoromethanesulfonates; esters of hydroxyimides; -bis-sulfonyl- diazomethanes; sulfonate esters of nitro-substituted benzyl alcohols; and napthoquinone-4-diazides.

* * * * *